United States Patent
Conesa Lareo

[19]

[11] Patent Number: 6,020,771
[45] Date of Patent: Feb. 1, 2000

[54] SMALL-SCALE, SIMPLIFIED-DESIGN FREQUENCY MULTIPLIER INCORPORATED INTO INTEGRATED CIRCUIT

[75] Inventor: Jose Luis Conesa Lareo, Madrid, Spain

[73] Assignee: Telefonica de Espana, S.A., Madrid, Spain

[21] Appl. No.: 08/957,607

[22] Filed: Oct. 27, 1997

[30] Foreign Application Priority Data

Dec. 16, 1996 [ES] Spain ...................................... 9602653

[51] Int. Cl.[7] .................................................. H03B 19/00
[52] U.S. Cl. ............................. 327/119; 327/116; 377/47
[58] Field of Search ........................... 327/119–122, 356; 368/155–157, 160, 168, 186, 187; 377/47

[56] References Cited

U.S. PATENT DOCUMENTS

| | | | |
|---|---|---|---|
| 4,244,027 | 1/1981 | Shai | 377/47 |
| 4,773,031 | 9/1988 | Tobin | 377/47 |
| 5,438,245 | 8/1995 | Kii et al. | 315/408 |
| 5,822,229 | 10/1998 | Steinbach | 364/703 |

*Primary Examiner*—Kenneth B. Wells
*Attorney, Agent, or Firm*—Thelen Reid & Priest, LLP

[57] ABSTRACT

A frequency multiplier integrated circuit (IC) has a frequency multiplier 1, an initialization signal generator 2, data sampling generator 3, and a clock generator 4. The frequency multiplier 1 has a timer 17 for calculating a first time between changes of state of an input signal, a time calculator 18 for a second time that a should occur between changes of state in the output signal, and an output signal generator 19 for generating the output signal. The initialization signal generator generates two initialization signals 12 and 13, one being the complement of the other, with a duration greater than 20 msec after an input initialization signal is received.

13 Claims, 1 Drawing Sheet

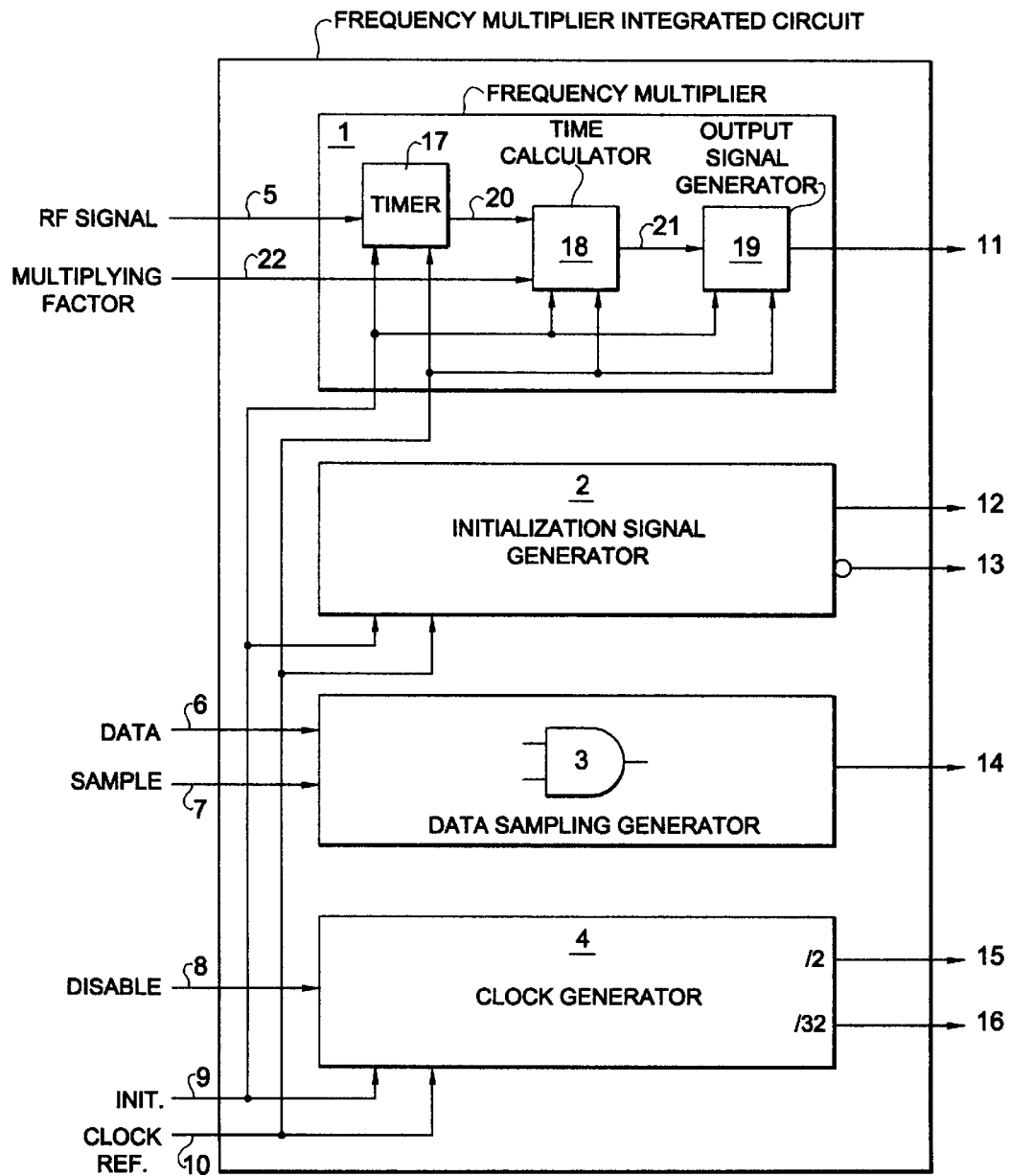

SMALL-SCALE, SIMPLIFIED-DESIGN FREQUENCY MULTIPLIER INCORPORATED INTO INTEGRATED CIRCUIT

REFERENCE TO FOREIGN APPLICATION

The present patent application claims priority to Spanish patent application 9 602 653, filed Dec. 16, 1996, which is incorporated herein by reference in its entirety.

BACKGROUND OF THE INVENTION

1. Field of the Invention

The invention has application in the field of telecommunications, in particular, digital telecommnunications systems. More specifically, the present invention relates to a frequency multiplier integrated circuit (IC) for generating a binary output signal with a frequency that is a multiple of the frequency of an input signal.

2. Related Art

In many systems, it is necessary to have clock signals of various frequencies to time the functions of various integrated circuits. Obtaining clocks derived from other circuits is simple, provided they can be obtained by dividing a reference clock's frequency by an integer number. However, sometimes it is necessary to obtain a clock signal with a frequency that is a multiple of that of a starting signal, a problem that is significantly more complicated.

Known high-precision commercial products are larger and more expensive than the frequency multiplier integrated circuit according to the present invention, which is configured as a smaller, more economical solution for those applications in which great precision is unnecesary. The inventive architecture includes, among other blocks, a frequency multiplier that generates a clock signal with a frequency that is a multiple of that of a reference signal.

SUMMARY OF THE INVENTION

The frequency multiplier integrated circuit (IC) provided by the prevent invention constitutes an economical and small solution for applications in which great precision is unnecessary. The preferred frequency multiplier IC includes, among other blocks, a frequency multiplier that generates a clock signal with a frequency that is a multiple of that of a reference signal.

More specifically, the inventive frequency multiplier integrated circuit includes a frequency multiplier, an initializtion signal generator, a data sampling generator, and a clock generator. The functioning of each of the blocks is independent of the others.

The frequency multiplier that generates a digital signal with a frequency that is a multiple of that of the periodic digital reference signal that enters it, includes a timer module, a time calculator module, and an output signal generator module.

The timer module is a counter that, by means of a clock signal with a frequency sufficiently greater than that of the reference signal, measures the time that intervenes between changes in state of the reference signal. This measured time, along with the number of times by which it is desired to multiply the frequency of the input signal to arrive at the frequency of the output signal serve as data inputs to the time calculator module. The time calculator module calculates the time in which a change in the state of the output signal should occur. This calculated time datum is provided to the output signal generator module, which produces a change of state in the output signal each time the calculated time elapses.

The initialization signal generator generates two signals, one being the complement of the other. The initialization signal generator is activated when an initialization signal input to the frequency multiplier integrated circuit is activated. These two signals generated by the initialiation signal generator enable activation of the various circuits that make up a system in an appropriate order. The deactivation of both signals occurs at the end of a certain time after deactivation of the input initialization signal.

The data sampling signal generator is a logical AND gate that generates an output signal obtained as a logical function AND between two input signals.

The clock generator generates two clock signals of frequencies that are submultiples of that of an input clock signal that serves as a reference. One of the two generated clock signals is enabled by an input signal to the clock generator, such that if it is high, its generation is disabled. The start of generation of the two clock signals occurs after deactivation of the initialization signal of the frequency multiplier integrated circuit.

BRIEF DESCRIPTION OF THE DRAWINGS

The invention is better understood by reading the following Detailed Description of the Preferred Embodiments with reference to the accompanying drawing figure, which illustrates a frequency multiplier integrated circuit (IC) according to a preferred embodiment of the present invention.

DETAILED DESCRIPTION OF THE REFERRED EMBODIMENTS

In describing preferred embodiments of the present invention illustrated in the drawings, specific terminology is employed for the sake of clarity, However, the invention is rot intended to be limited to the specific teriology so selected, and it is to be understood that each specific element includes all technical equivalents that operate in a similar manner to accomplish a similar purpose.

The drawing figure illustrated a frequency multiplier integrated circuit that includes a frequency multiplier 1, an initialization signal generator 2, a data sampling generator 3, and a clock generator 4. The functioning of each of these blocks is independent of the others.

Frequency multiplier 1 generates a digital signal 11 with a frequency that is a multiple of the frequency of a periodic digital reference signal 5. The frequency multiplier includes a timer module 17, a time calculator module 18, and an output signal generator module 19.

Time module 17 is a counter that, by means of a clock signal 10 with a frequency sufficiently greater than that of the reference signal 5, measures a time that intervenes between changes in state of reference signal 5. This measured time, along with the number of times by which it is desired to multiply the frequency of the reference signal to arrive at the frequency of the output signal, is input to the time calculator module 18 on signals lines 20 and 22, respectively. The time calculator module 18 calculates the time at which a change in state of the output signal 11 should occur. Then, this calculated time datum is sent, via signal line 21, to output signal generator module 19, which produces a change of state in the output signal 11 each time that the calculated time elapses.

For optimal functioning of the frequency multiplier 1, reference signal 5 must be being periodic and have a duty cycle (indicating relation between the time when the signal is high and when it is low) near 50%. Any variation of these factors will degrade the duty cycle of output signal 11.

The start of generation of the output signal 11 occurs after deactivation of an initialization input signal 9. Initialization signal generator 2 generates two initialization signals 12 and 13, one being the complement of the other, with a waiting time greater than 20 msec. The generation of these signals is activated when the initialization input signal 9 of the frequency multiplier integrated circuit is activated, and terminates as soon as the waiting time (greater than 20 msec) is reached. Signals 12 and 13 enable activation of the various circuits that make up a system in an appropriate order.

Data sampling generator 3 is preferably a logical AND gate that generates an output signal 14, obtained as a logical function AND between DATA and SAMPLE input signals 6 and 7, respectively.

Clock generator 4 generates two clock signals 15 and 16, based on reference signal 10. In a preferred embodiment, the frequency of clock signal 15 is half that of reference signal 10, and the frequency of clock signal 16 is that of the reference signal 10 divided by 32. Generation of clock signal 16 is enabled by an input signal 8, such that if the disable/enable signal is high, generation of clock signal 16 is disabled. The start of the generation of the two clock signals 15 and 16 occurs after deactivation of initialization input signal 9.

It is not deemed necessary to make this description more extensive for any person skilled in the art to understand the scope of the invention and the advantages derived therefrom. The materials, shape, size, and disposition of the elements may be altered provided that it presupposes no change in the essence of the invention. The terms in which this description has been made must always be interpreted broadly and non-restrictively. Modifications and variations of the above-described embodiments of the present invention are possible, as appreciated by those skilled in the art in light of the above teachings. It is therefore to be understood that, within the scope of the appended claims and their equivalents, the invention may be practiced otherwise than as specifically described.

What is claimed is:

1. A frequency multiplier integrated circuit (IC) comprising:
   a) a frequency multiplier including:
      1) a timer, receiving (1) a first reference input signal having a first frequency and (2) a second input signal having a second frequency that is greater than the first frequency, for measuring a first time interval between changes of state of the first reference input signal;
      2) a time calculator, receiving (1) the first time interval measured by the timer, and (2) a factor signal indicating a number of times by which to multiply the first frequency of the reference input signal to arrive at a third frequency for a frequency multiplier output signal, for calculating a second time interval to occur between changes of state in the frequency multiplier output signal; and
      3) an output signal generator, receiving (1) the calculated second time interval from the time calculator and (2) the second input signal, for generating the frequency multiplier output signal having the third frequency;
   b) an initialization signal generator for generating an output initialization signal;
   c) a data sampling signal generator for sampling data that is input to the IC; and
   d) a clock generator for generating additional clock signals whose respective frequencies are related to the second frequency.

2. The IC of claim 1, wherein:
   the frequency multiplier, the initialization signal generator, the data sampling signal generator, and the clock generator are integrated in the IC; and
   an initialization input signal and the second input signal are both input to the frequency multiplier, the initialization signal generator, and the clock generator.

3. The IC of claim 2, wherein:
   the initialization signal generator generates the output initialization signal having a deactivation time that occurs a certain delay after deactivation of the initialization input signal.

4. The IC of claim 1, wherein:
   the clock generator generates the additional clock signals with respective frequencies that are respective submultiples of the second input signal; and
   one of the additional clock signals is enabled by an external signal that is input to the clock generator.

5. The IC of claim 2, wherein:
   the clock generator generates the additional clock signals with respective frequencies that are respective submultiples of the second input signal; and
   one of the additional clock signals is enabled by an external signal that is input to the clock generator.

6. The IC of claim 3, wherein:
   the clock generator generates the additional clock signals with respective frequencies that are respective submultiples of the second input signal; and
   one of the additional clock signals is enabled by an external signal that is input to the clock generator.

7. A frequency multiplier, comprising:
   a) a timer, receiving (1) a first reference input signal having a first frequency and (2) a second input signal having a second frequency that is greater than the first frequency, for measuring a first time interval between changes of state of the first reference input signal;
   b) a time calculator, receiving (1) the first time interval measured by the timer, and (2) a factor signal indicating a number of times by which to multiply the first frequency of the reference input signal to arrive at a third frequency for a frequency multiplier output signal, for calculating a second time interval to occur between changes of state in the frequency multiplier output signal; and
   c) an output signal generator, receiving (1) the calculated second time interval from the time calculator and (2) the second input signal, for generating the frequency multiplier output signal having the third frequency.

8. A frequency multiplier integrated circuit (IC) comprising:
   a) a frequency multiplier including:
      1) a timer, receiving (1) a first reference input signal having a first frequency and (2) a second input signal having a second frequency that is greater than the first frequency, for measuring a first time interval between changes of state of the first reference input signal;

2) a time calculator, receiving (1) the first time interval measured by the timer, and (2) a factor signal indicating a number of times by which to multiply the first frequency of the reference input signal to arrive at a third frequency for a frequency multiplier output signal, for calculating a second time interval to occur between changes of state in the frequency multiplier output signal; and 3) an output signal generator, receiving the calculated second time interval from the time calculator, for generating the frequency multiplier output signal having the third frequency;

b) an initialization signal generator for generating an output initialization signal;

c) a data sampling signal generator for sampling data that is input to the IC; and d) a clock generator for generating additional clock signals whose respective frequencies are related to the second frequency;

wherein an initialization input signal and the second input signal are both input to the frequency multiplier, the initialization signal generator, and the clock generator.

9. The IC of claim 8, wherein:

the frequency multiplier, the initialization signal generator, the data sampling signal generator, and the clock generator are integrated in the IC.

10. The IC of claim 9, wherein:

the initialization signal generator generates the output initialization signal having a deactivation time that occurs a certain delay after deactivation of the initialization input signal.

11. The IC of claim 8, wherein:

the clock generator generates the additional clock signals with respective frequencies that are respective submultiples of the second input signal; and one of the additional clock signals is enabled by an external signal that is input to the clock generator.

12. The IC of claim 9, wherein:

the clock generator generates the additional clock signals with respective frequencies that are respective submultiples of the second input signal; and one of the additional clock signals is enabled by an external signal that is input to the clock generator.

13. The IC of claim 10, wherein:

the clock generator generates the additional clock signals with respective frequencies that are respective submultiples of the second input signal; and one of the additional clock signals is enabled by an external signal that is input to the clock generator.

* * * * *